(12) United States Patent
Cai et al.

(10) Patent No.: US 10,051,763 B2
(45) Date of Patent: Aug. 14, 2018

(54) LOCAL STRESS-RELIEVING DEVICES, SYSTEMS, AND METHODS FOR ELECTRONIC ASSEMBLIES

(71) Applicant: Intel Corporation, Santa Clara, CA (US)

(72) Inventors: Yuhong Cai, Folsom, CA (US);
Min-Thi Lai, Orangeville, CA (US);
Garrick Chow, Foster City, CA (US);
Lianhua Fan, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,331

(22) Filed: Oct. 1, 2016

(65) Prior Publication Data

US 2018/0098421 A1 Apr. 5, 2018

(51) Int. Cl.
*H05K 7/20* (2006.01)
*H01L 23/40* (2006.01)
*H05K 1/02* (2006.01)

(52) U.S. Cl.
CPC ....... *H05K 7/2049* (2013.01); *H01L 23/4006* (2013.01); *H05K 1/0203* (2013.01);
(Continued)

(58) Field of Classification Search
CPC .. H05K 7/2049; H05K 1/0271; H05K 1/0203; H05K 1/181; H01L 23/4006; H01L 23/4093
(Continued)

(56) References Cited

U.S. PATENT DOCUMENTS 5,061,137 A * 10/1991 Gourd ................... F16B 19/00
411/392
6,317,328 B1 11/2001 Su
(Continued)

FOREIGN PATENT DOCUMENTS

EP 2251903 B1 11/2010
WO WO 2006/070121 A1 7/2006

OTHER PUBLICATIONS

International search report dated Dec. 5, 2017, in PCT Application No. PCT/US2017/049993, filed Sep. 3, 2017; 15 pages.

*Primary Examiner* — Zachary M Pape
(74) *Attorney, Agent, or Firm* — Thorpe North & Western, LLP; David W. Osborne

(57) ABSTRACT

Electronic device package technology is disclosed. In one example, an electronic device includes a substrate having at least one electronic component mounted thereon and a heatsink thermally coupled to the electronic component. A plurality of fasteners attaches the heatsink to the substrate. At least one of the substrate, the heatsink, and the plurality of fasteners include a stress-relieving component to minimize fastener stress on the substrate. The stress-relieving component can comprise a fastener having a compliant device (e.g., a spring) for z-direction stress relief. The stress-relieving component can comprise the substrate and/or the heatsink having an oversized aperture for x-direction and/or y-direction stress relief. A method is disclosed for coupling a substrate to a heatsink. A method is disclosed for minimizing fastener stress locally to fasteners of an electronic device.

16 Claims, 4 Drawing Sheets

(52) U.S. Cl.
CPC ............... *H01L 2023/4062* (2013.01); *H01L 2023/4087* (2013.01); *H05K 1/0271* (2013.01)

(58) Field of Classification Search
USPC ............... 24/458, 459, 520; 411/107, 353; 248/220.21, 222.2, 222.14, 560
See application file for complete search history.

(56) References Cited

U.S. PATENT DOCUMENTS

| | | | |
|---|---|---|---|
| 7,495,922 B2* | 2/2009 | Ploeg | H01L 23/40 257/718 |
| 7,573,716 B2* | 8/2009 | Sun | H05K 1/0201 165/80.3 |
| 7,869,217 B2* | 1/2011 | Chen | H01L 23/4093 165/80.2 |
| 7,896,597 B2* | 3/2011 | Hu | F16B 5/0275 411/168 |
| 8,373,990 B2* | 2/2013 | Jarmany | H05K 7/20445 174/526 |
| 2003/0159819 A1 | 8/2003 | Lee | |
| 2008/0239678 A1 | 10/2008 | Ploeg et al. | |
| 2009/0021918 A1* | 1/2009 | Fang | H01L 23/3672 361/720 |
| 2014/0055955 A1 | 2/2014 | Chen | |
| 2014/0222011 A1* | 8/2014 | Keller | B32B 1/00 606/104 |
| 2015/0349446 A1* | 12/2015 | Zantout | H01R 4/4818 439/74 |

\* cited by examiner

LOCAL STRESS-RELIEVING DEVICES, SYSTEMS, AND METHODS FOR ELECTRONIC ASSEMBLIES

TECHNICAL FIELD

Embodiments described herein relate generally to electronic assemblies, and more particularly to electronic devices, systems, and methods that may encounter local stress.

BACKGROUND

During operation, electronic components of an electronic device typically generate a significant amount of heat. Such heat can be managed, at least in part, by a heat sink or heat spreader fixed proximate the electronic components. To maximize the thermal transfer from the electronic components to the heat sink, it is important to hold the heatsink and electronic components tightly together and minimize any space between them. Thermal grease can be used to fill any gaps.

While a tight junction between the electronic components and the heat sink can help to maximize thermal transfer efficiency, because the electronic components have a different coefficient of thermal expansion than that of the heatsink, a number of issues can arise. One significant issue is the stress created between the electronic components and the heat sink. Such stress can facilitate local cracking or failing of the electronic device/components proximate respective fasteners that attach the heatsink to the electronic device.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
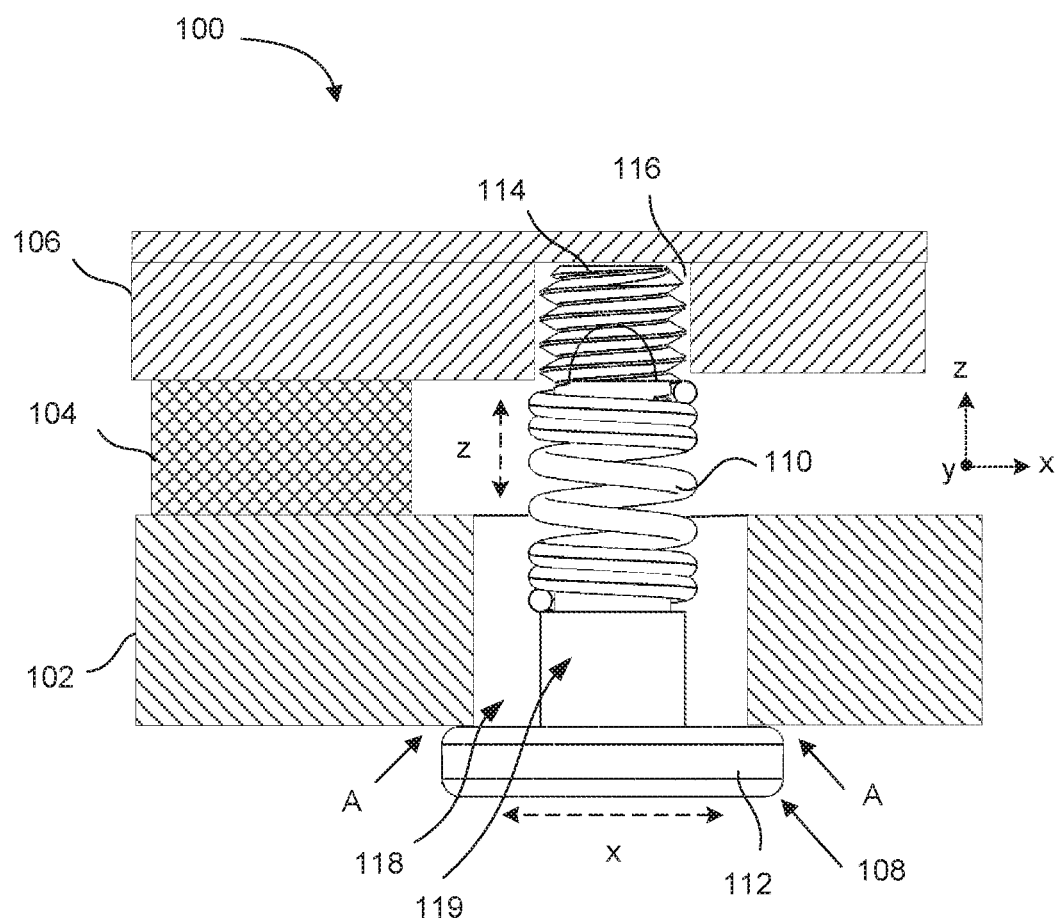
FIG. 1 shows a schematic of a compliant fastener coupling an electronic device to a heatsink in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include support for plural referents unless the context clearly dictates otherwise. Thus, for example, reference to "a fastener" includes support for a plurality of such fasteners.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the written description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the written description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" is defined as actual physical contact between two objects, structures, or items. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular component, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Circuitry used in electronic components or devices (e.g. a die) of an electronic device package can include hardware, firmware, program code, executable code, computer instructions, and/or software. Electronic components and devices can include a non-transitory computer readable storage medium, which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid-state drive, or other medium for storing electronic data. Node and wireless devices may also include a transceiver module, a counter module, a processing module, and/or a clock module or timer module. One or more programs that may implement or utilize any techniques described herein may use an application-programming interface (API), reusable controls, and the like. Such programs may be implemented in a high level procedural or object oriented programming language to communicate with a computer system. However, the program(s) may be implemented in device or machine language, if desired. In any case, the language may be a compiled or interpreted language, and combined with hardware implementations.

Furthermore, the described components, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential components of the technology nor is it intended to limit the scope of the claimed subject matter.

Various stress-relieving components or mechanisms can be used in an effort to manage thermally created stresses between heat generating electronic components and a heat sink. In one aspect, an electronic device is disclosed that comprises: a substrate having at least one electronic component mounted thereon; a heatsink thermally coupled to the at least one electronic component; and a plurality of fasteners coupling the heatsink to the substrate, wherein at least one of the substrate, the heatsink, and the plurality of fasteners include a stress-relieving component to minimize fastener stress on the substrate. The stress-relieving component can comprise at least one of the fasteners having a compliant device (e.g., a spring) configured to expand and contract to minimize fastener stress. The stress-relieving component can also comprise one of the substrate or the heatsink having an oversized aperture that receives one of the fasteners such that said fastener is slidably interfaced to the one of the substrate or the heatsink in at least one degree of freedom during said heat transfer. Said stress-relieving components can relieve stress on the electronic device in one, two, or three directional degrees of freedom.

In an additional aspect, a method is disclosed for coupling a substrate to a heatsink. The method can comprise coupling a heatsink to a substrate with a plurality of fasteners, wherein at least one of the substrate, the heatsink, and the plurality of fasteners include a stress-relieving component to minimize fastener stress on the substrate. A method of minimizing fastener stress locally to fasteners of an electronic device is further disclosed, as discussed herein.

FIG. 1 shows an electronic device 100 comprising a substrate 102 having an electronic component 104 (e.g., a semiconductor or other chip) mounted thereon. A heatsink 106 is thermally coupled to the electronic component 104 to transfer heat therefrom during (or after) operation of the electronic component 104. The substrate 102 is coupled to the heatsink by a fastener 108. Generally, at least one of the substrate 102, the heatsink 106, and the fastener 108 include a stress-relieving component that minimizes fastener stress on the substrate 102 proximate the fastening location of the fastener 108.

In one example, the stress-relieving component comprises the fastener 108 having a compliant device 110 configured to expand and contract that minimizes fastener stress proximate a fastening area A adjacent the substrate 102. In this example, the compliant device 110 is a spring attaching a head body 112 to a threaded body 114 of the fastener 108. Thus, because the heatsink 106 has a coefficient of thermal expansion (e.g., an aluminum heatsink) different than the coefficient of thermal expansion of the electronic component 104 (e.g., a semiconductor), during heat transfer the heatsink 106 tends to expand or contract (i.e., slight molecular movement) at a different rate than the electronic component 104 would expand or contract. During such differing expansion or contraction, the compliant device 110 may slightly move or flex about the z-direction, thereby minimizing fastener stress proximate the fastening area A. As such, the fastener 108 relieves fastener stress on the substrate 102 generally about the z-direction of the electronic device 100. However, it will be appreciated that stress can be relieved about the compliant device 110 in the x-direction and/or y-direction as well, to some degree, because springs can bend in such directions.

In some aspects, the head body 112 includes a recess or slot (not shown in detail) to receive an end of the compliant device 108, and the threaded body 114 includes a recess or slot to receive the other end of the compliant device 108. Alternatively or concurrently, an adhesive can be used to secure the compliant device 110 to the bodies 112 and 114.

The threaded body 114 may be threadably attached to a threaded bore 116 in the heatsink 106 (heatsink threads not shown in detail). Alternatively, the threaded body 114 may extend through an aperture of the heatsink 106 and be threadably fastened to a nut (not shown) on the upper side of the heatsink 106. In some aspects, the compliant device 110 is any device coupled between the bodies 112 and 114 and capable of expanding and/or contracting to relieve stress as described herein, such as a leaf spring, elastomer, etc.

While the stress-relieving fastener is primarily depicted in FIGS. 1 an 2 as a bolt or screw having a spring segment (i.e. compliant device), it is to be understood that any device, structure, mechanism, or configuration that can effectively hold a heat sink in sufficient proximity to a heat generating electronic component so as to effectively facilitate heat transfer, while at the same time reducing or minimize stress induced by coefficient of thermal expansion differences is contemplated within the present disclosure. Exemplary fasteners can include pins, clips, straps, rivets, anchors, tethers, etc. which include a compliant device or property such as the spring shown FIGS. 1 and 2, or any other structure, feature, or mechanism that holds the heat sink and electronic component together in a heat transferring relationship while providing relief during expansion of either the heat sink, electronic component, or both.

In another example, the stress-relieving component comprises one of the substrate 102 and the heatsink 106 having an oversized aperture that receives any fastener (e.g., the compliant fastener 108, or a typical threaded fastener). In this example, said fastener is slidably interfaced to the one of the substrate or the heatsink in at least one degree of freedom. For instance, as shown on FIG. 1 the substrate 102 has an oversized aperture 118 that loosely receives the fastener 108, which creates a slidable interface between the fastener 108 and the substrate 102 to allow the fastener 108 to freely (and slightly) move (i.e., relieve stress) about the x-direction and/or y-direction during heat transfer. As shown by FIG. 1, the cross sectional area of the aperture 118 is larger than the cross sectional area of a shaft portion 119 of the fastener 108. This "oversized aperture" configuration is particularly useful in assemblies that have a plurality of fasteners securing a heatsink to a substrate about a relatively large area of a substrate, for instance. In this case, the heatsink tends to exert pulling or pushing forces on the electronic components of a substrate in the x/y directions during heat transfer (e.g., see FIG. 2).

Inversely to the example of FIG. 1, in some embodiments, the stress-relieving component can be an oversized aperture formed in the heatsink and the fastener can be threadably coupled to the substrate (not shown). In either case, the described "slidable movement" between the fastener 108 and the substrate 102 may be invisible to the naked-eye because the fastener is likely merely relieving preloaded clamping stress proximate the fastening area A (depending on the particular design of the electronic device). Regardless, when incorporating a compliant fastener (e.g., z-direction stress relief) through an oversized aperture (e.g., x and/or y direction stress relief), the substrate can experience stress relief in three degrees of directional freedom relative to the clamping force exerted on the substrate by the fastener, which can dramatically minimize the likelihood of cracks or failures to the substrate and/or the electronic components thereon.

Figure 2:
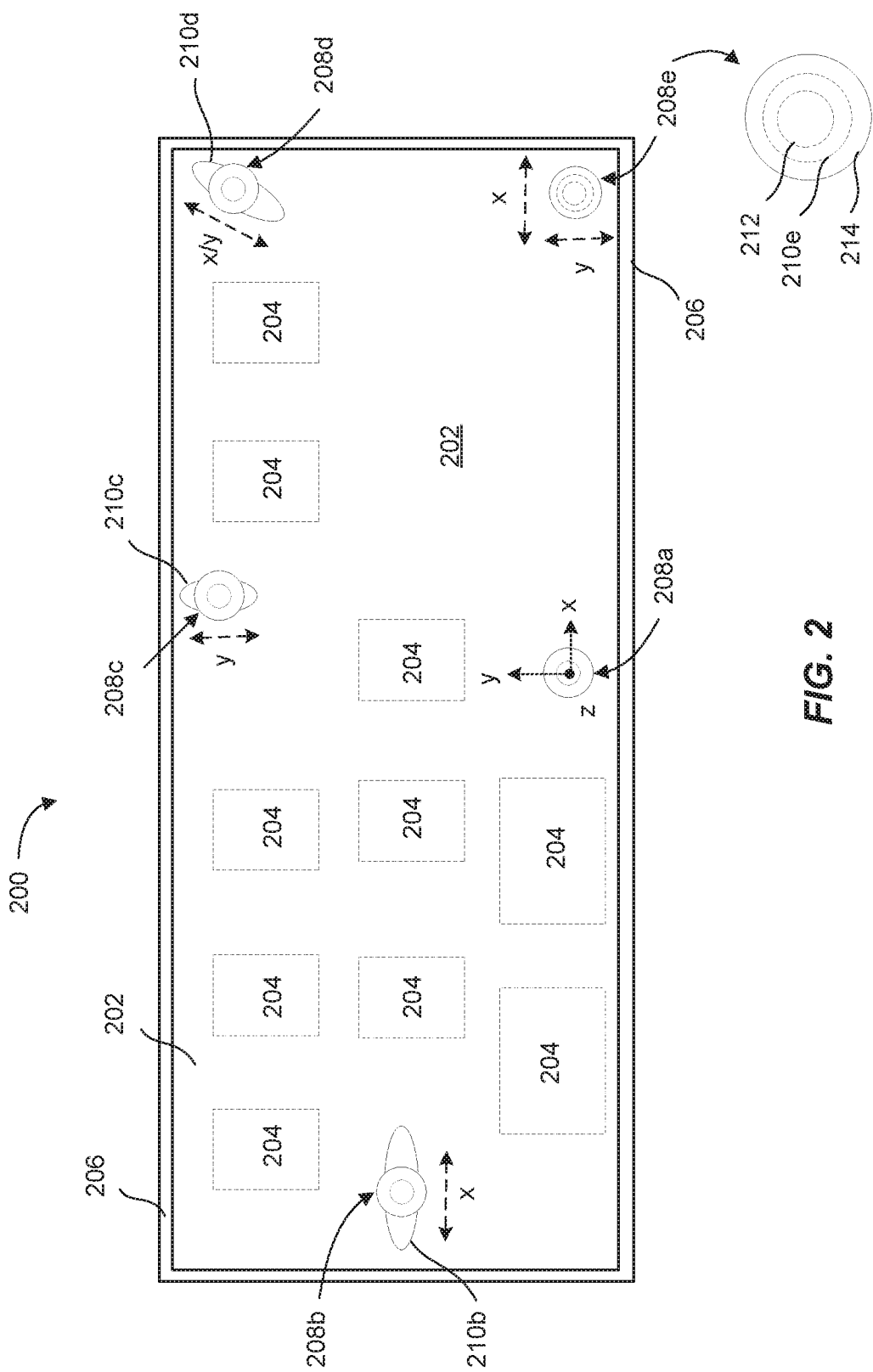
FIG. 2 shows a schematic of a bottom view of an electronic device in accordance with an example.

FIG. 2 shows an electronic device/assembly 200 from a bottom perspective relative to the example of FIG. 1. The electronic device 200 comprises a substrate 202 (e.g., a PCB) having a plurality of electronic components 204. The substrate 202 is secured to a heatsink 206 by a plurality of fasteners 208a-e (the heatsink 206 is shown larger than the substrate 202 for purposes of illustration to show that the heatsink is on the other side of the substrate, like FIG. 1). As described regarding FIG. 1, the electronic components 204 are compressed or "sandwiched" between the substrate 202 and the heatsink 206 (in a typical manner) such that heat transfers to the heatsink 206 from the electronic components 204 during and after operation. Each fastener 208a-e can include a shaft (represented by the dashed, concentric circle at the central most location of each example fastener) extending through the substrate 202 and threaded or otherwise secured to the heatsink 206 on the other side of the electronic components 204 (as with FIG. 1). Said shaft of each fastener may be a typical threaded fastener, or it may be the compliant fastener configuration as described with reference to FIG. 1 (depending on the desired stress-relieving requirements of a particular electronic device).

In one example, fastener 208a can define a fixed reference point for assembly processes of the device 200 and/or for the particular design and configuration of each stress-relieving component of the device 200. Specifically, fastener 208a can be a typical threaded fastener used with existing substrate-to-heatsink fastening, while some or all of the other fasteners 208b-e are the fasteners having a compliant device as described with reference to FIG. 1. Therefore, during computational operation of one or more electronic components 204 (i.e., as heat transfers to the heatsink 206), the compliant fasteners 208b-e, for instance, can relieve stress on the substrate 202 proximate the fastening location of each of said fasteners in approximately the z-direction. Alternatively or concurrently, the substrate 202 can include at least one stress-relieving component. For example, at the location of fastener 208b, the substrate 202 includes an oversized aperture 210b having an elongated slot shaped in approximately the x-direction. The particular shape and orientation (i.e., an x-directional slot) of the oversized aperture 210b is dictated by the vector of the fastener 208b relative to the fixed fastener 208a. Specifically, because fastener 208b is located substantially along the x-axis direction relative to the fixed fastener 208a, the oversized aperture 201b is an elongated slot along the x-axis to maximize the amount of stress relief on the substrate 202 proximate the fastener 208b. Similarly (but directionally inverse), fastener 208c is located substantially along the y-axis relative to fixed fastener 208a, and therefore, oversized aperture 210c is an elongated slot shaped in a direction along the y-axis. Moreover, (for purposes of illustration) fastener 208d is at a located substantially in a direction along both the x-axis and the y-axis relative to fixed fastener 208a. Therefore, oversized aperture 210d is an elongated slot in a slanted direction along both the x and y axes.

A particular oversized aperture need not be a slot, however. Rather it can be any shape that has a cross sectional area larger than a cross sectional area of the shaft portion of a fastener. For example, fastener 208d is disposed through a circular oversized aperture 210e such that a compliant shaft 212 is loosely received through aperture 210e, and such that a head body 214 is slidably interfaced to the substrate 202 about the x-axis and y-axis to relieve stress about said axes. Combining the examples of stress-relieving components (i.e., a compliant fastener 208e and an oversized aperture 210e) provides stress relief along all three axes or directions relative to the fixed fastener 208a. Practically speaking, these "three stress-relieving directions" combine to provide a general area or region of stress relief proximate the fastener 208e, for instance.

In addition to the particular design of the direction of a particular oversized aperture, each aperture can have an elongated slot length depending on the distance of a particular aperture from the fixed fastener 208a. For instance, fastener 210b is a known distance away from fastener 208a, which is a farther distance than the distance of fastener 210c from the fixed fastener 208a. Thus, oversized aperture 210b has an elongated slot that is longer than the elongated slot of aperture 210c. The length of each slot may vary depending on the particular requirements of the electronic device; however, slot apertures closer to the fixed fastener can be shorter than slots farther away from the fixed fastener to account for the collective thermal expansion or contraction of the heatsink relative to the substrate.

Generally, clamping forces exerted on a substrate via a plurality of fasteners can be between 5 and 70 psi. The present disclosure of stress-relieving component(s) can result in a lower clamping force of 5 to 20 psi, which is a significant reduction on stresses exerted on the substrate. Moreover, the force exerted by a compliant fastener of the present disclosure would be calculated as follows: (heatsink clamping pressure)*(heatsink contact area)/(number of screws). In one example, assuming 4 to 10 compliant fasteners are used in a particular electronic assembly, and the heatsink contact area is 12 square inches, a range of desired screw clamping forces would be from 6 to 60 pounds of force. Moreover, the choice of a spring constant for a particular compliant fastener would vary depending on the amount of stretching (i.e., displacement of one end of the spring). For example, an elongated length of an oversized aperture can range from 0.25 to 0.5 inches. Following Hooke's law for linear spring behavior, the range of spring constants vary from 12 to 240 pounds/inch. In one example, a particular compliant fastener can have a shaft diameter between 1 mm to 3 mm.

The distance fastener bodies can move from each other and the distance the heatsink can move from the chips are related. The limiting factor is the distance the heatsink can move from the electronic components (e.g., chips), while still removing heat from the chips. This is determined by the Young's modulus and adhesion force/pressure of the thermal interface material (TIM) between the heatsink and the electronic components. Said modulus defines the pressure/distance, and the separation of the TIM, through tensile pressure in excess of the adhesion force of the TIM from either surface; therefore the amount of distance allowed is defined as follows: (the adhesion force of the TIM)/(the modulus of the TIM)*(the thickness of the TIM). Selection of TIM materials can be used to fine-tune those variables. A safety factor can be expected to be applied to the maximum distance that the heatsink can move from the chips before failure.

In one example, assume a coefficient of thermal expansion mismatch of around 10 millionths per degree Celsius (between the heatsink and the substrate), a max substrate screw-to-screw distance of 300 mm (such as in a large tablet device), and assume a max temperature fluctuation of an electronics assembly of 100 degrees Celsius. Thus, assuming a 2 mm diameter hole known in the prior art, the effective elongated slot length of an oversized aperture of the present disclosure can be an additional 0.3 mm, therefore resulting in a 2.3 mm elongated slot. This is significant because the slot length has increased 15% in elongation along the direction of the fixed-screw-to-free-screw vector.

Figure 3:
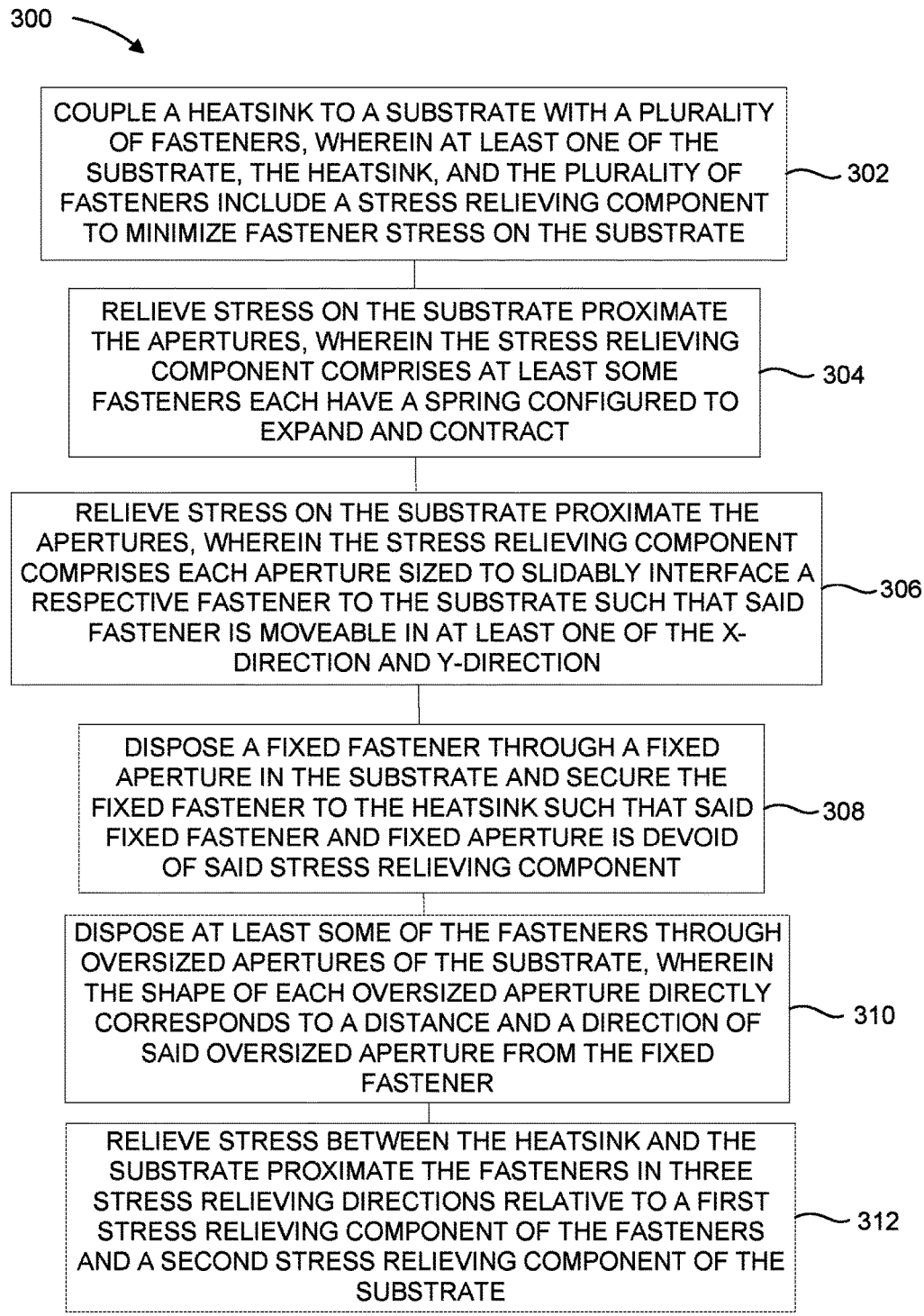
FIG. 3 shows a method in accordance with an example.

FIG. 3 shows a method 300 for coupling a substrate to a heatsink. The method can comprise step 302 of coupling a heatsink to a substrate with a plurality of fasteners, wherein at least one of the substrate, the heatsink, and the plurality of fasteners include a stress-relieving component to minimize fastener stress on the substrate. Step 304 comprises relieving stress on the substrate proximate the apertures, wherein the stress-relieving component comprises at least some fasteners each have a spring configured to expand and contract. Step 306 comprises relieving stress on the substrate proximate the apertures, wherein the stress-relieving component comprises each aperture sized to slidably interface a respective fastener to the substrate such that said fastener is moveable in at least one of the x-direction and y-direction. Step 308 comprises disposing a fixed fastener through a fixed aperture in the substrate and securing the fixed fastener to the heatsink such that said fixed fastener and fixed aperture is devoid of said stress-relieving component. Step 310 comprises disposing at least some of the fasteners through oversized apertures of the substrate, wherein the shape of each oversized aperture directly corresponds to a distance and a direction of said oversized aperture from the fixed fastener. Step 312 comprises relieving stress between the heatsink and the substrate proximate the fasteners in three stress-relieving directions relative to a first stress-relieving component of the fasteners and a second stress-relieving component of the substrate.

Figure 4:
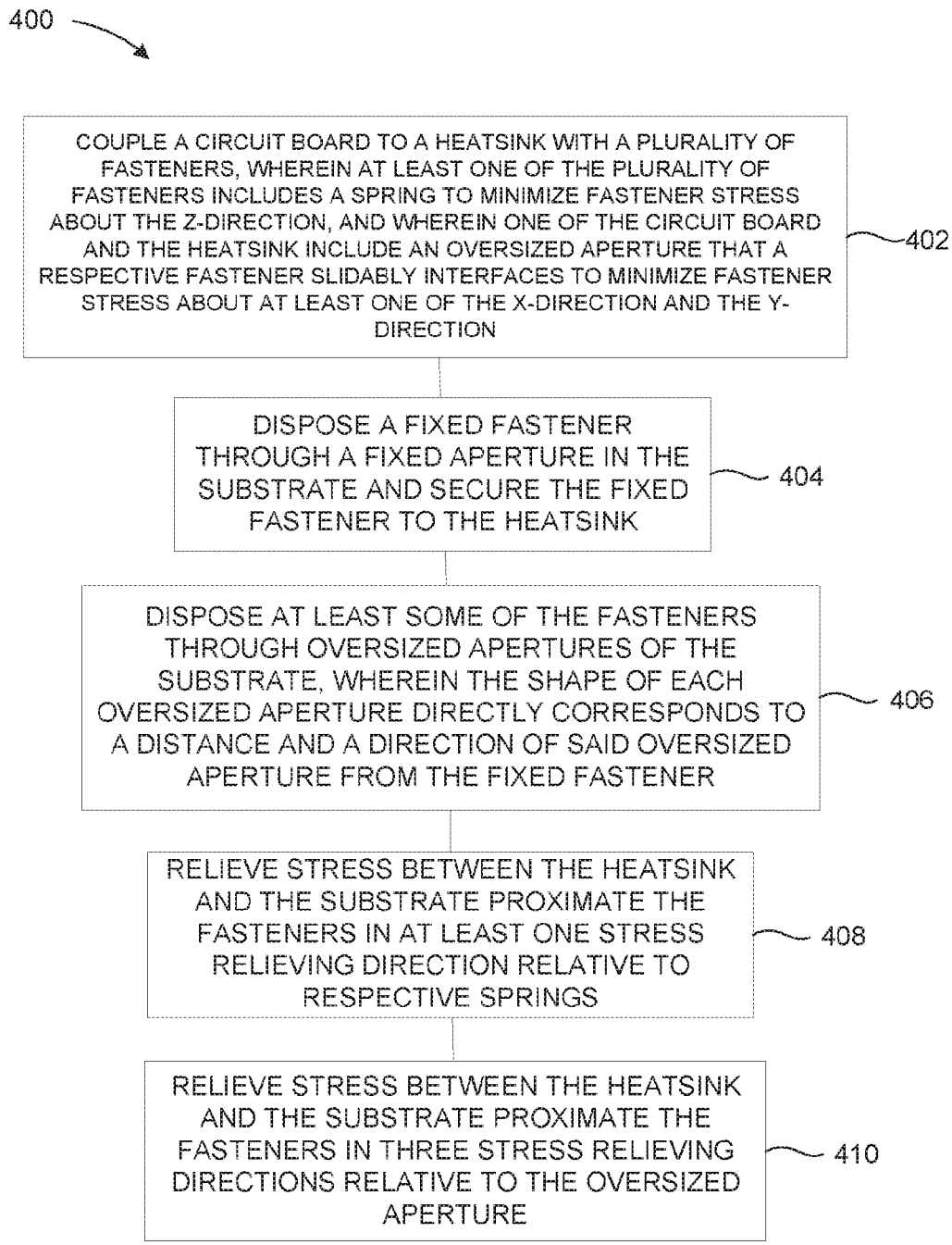
FIG. 4 shows a method in accordance with an example.

FIG. 4 shows a method 400 for minimizing fastener stress exerted on a circuit board. The method can comprise step 402 coupling a circuit board to a heatsink with a plurality of fasteners, wherein at least one of the plurality of fasteners includes a spring to minimize fastener stress about the z-direction, and wherein one of the circuit board and the heatsink include an oversized aperture that a respective fastener slidably interfaces to minimize fastener stress about at least one of the x-direction and the y-direction. Step 402 comprises disposing a fixed fastener through a fixed aperture in the substrate and securing the fixed fastener to the heatsink. Step 404 comprises disposing at least some of the fasteners through oversized apertures of the substrate, wherein the shape of each oversized aperture directly corresponds to a distance and a direction of said oversized aperture from the fixed fastener. Step 406 comprises relieving stress between the heatsink and the substrate proximate the fasteners in at least one stress-relieving direction relative to respective springs. Step 408 comprises relieving stress between the heatsink and the substrate proximate the fasteners in three stress-relieving directions relative to the oversized aperture.

EXAMPLES

The following examples pertain to further embodiments.

In one example there is provided, an electronic device comprising: a substrate having at least one electronic component mounted thereon; a heatsink thermally coupled to the at least one electronic component; and a plurality of fasteners coupling the heatsink to the substrate, wherein at least one of the substrate, the heatsink, and the plurality of fasteners include a stress-relieving component to minimize fastener stress on the substrate.

In one example of the electronic device, the stress-relieving component comprises at least one of the fasteners having a compliant device configured to expand and contract to minimize fastener stress.

In one example of the electronic device, the compliant device is a spring, wherein said fastener comprises a head body and a threaded body attached together by the spring.

In one example of the electronic device, the stress-relieving component comprises one of the substrate or the heatsink having an oversized aperture that receives one of the fasteners such that said fastener is slidably interfaced to the one of the substrate or the heatsink in at least one degree of freedom during said heat transfer, and wherein the fastener is threadably secured to the other one of the substrate or the heatsink.

In one example of the electronic device, the substrate includes the oversized aperture, wherein the oversized aperture has a cross sectional area larger than a cross sectional area of said fastener to facilitate said slidable interface.

In one example of the electronic device, the substrate includes a plurality of components each comprising an oversized aperture to slidably receive a respective fastener of the plurality of fasteners.

In one example of the electronic device, at least some of the plurality of fasteners each include a stress-relieving component comprising a spring configured to expand and contract to minimize fastener stress proximate the respective oversized aperture.

In one example of the electronic device, the respective fasteners are freely movable in the respective oversized aperture in at least one of the x-direction and the y-direction relative to the substrate to minimize fastener stress on the substrate.

In one example of the electronic device, the spring expands and contracts in the z-direction relative to the substrate to minimize fastener stress on the substrate.

In one example of the electronic device, the substrate and the heatsink are coupled to each other by at least one fixed fastener defining a fixed reference point.

In one example of the electronic device, the substrate includes a plurality of stress-relieving components each comprising an oversized aperture that slidably receives a respective fastener in at least one of the x-direction and the y-direction.

The device of claim 11, wherein a shape of each oversized aperture of each stress-relieving component directly corresponds to a distance and a direction of each respective oversized aperture from the fixed reference point.

In one example of the electronic device, each fastener is threadably secured to a threaded bore in the heatsink, and wherein at least some of the fasteners are disposed through a respective oversized aperture in the substrate and slidably interfaced to the substrate in at least one of the x-direction and y-direction.

In one example of the electronic device, the substrate comprises an electronic assembly having a plurality of electronic components positioned between the heatsink and the electronic assembly.

In one example there is provided a computing system comprising a motherboard having at least one device as in claim 1.

In one example, the computing system comprises a desktop computer, a laptop, a tablet, a smartphone, a server, or a combination thereof.

In one example, the computing system a processor, a memory device, a primary heat sink, a radio, a slot, a port, or a combination thereof operably coupled to the motherboard.

In one example there is provided a method of coupling a substrate to a heatsink, the method comprises coupling a heatsink to a substrate with a plurality of fasteners, wherein at least one of the substrate, the heatsink, and the plurality of fasteners include a stress-relieving component to minimize fastener stress on the substrate.

In one example of the method of coupling the substrate to the heatsink, the substrate comprises at least one electronic component thermally coupled to the heatsink, and a plurality of apertures that receive respective fasteners.

In one example of the method of coupling the substrate to the heatsink, the method further comprises relieving stress on the substrate proximate the apertures, wherein the stress-relieving component comprises at least some fasteners each have a spring configured to expand and contract.

In one example of the method of coupling the substrate to the heatsink, the method further comprises relieving stress on the substrate proximate the apertures, wherein the stress-relieving component comprises each aperture sized to slidably interface a respective fastener to the substrate such that said fastener is moveable in at least one of the x-direction and y-direction.

In one example of the method of coupling the substrate to the heatsink, the method further comprises: threadably securing the plurality of fasteners to the heatsink; relieving stress on the substrate proximate the apertures with a first stress-relieving component comprising at least some fasteners each having a spring configured to expand and contract to relieve stress in the z-direction; and relieving stress on the substrate proximate the apertures with a second stress-relieving component comprising each aperture sized to slidably interface a respective fastener to the substrate such that said fastener is moveable in at least one of the x-direction and y-direction.

In one example of the method of coupling the substrate to the heatsink, the method further comprises disposing a fixed fastener through a fixed aperture in the substrate and securing the fixed fastener to the heatsink such that said fixed fastener and fixed aperture is devoid of said stress-relieving component.

In one example of the method of coupling the substrate to the heatsink, the method further comprises disposing at least some of the fasteners through oversized apertures of the substrate, wherein the shape of each oversized aperture directly corresponds to a distance and a direction of said oversized aperture from the fixed fastener.

In one example of the method of coupling the substrate to the heatsink, the method further comprises relieving stress between the heatsink and the substrate proximate the fasteners in at least one stress-relieving direction relative to the stress-relieving component.

In one example of the method of coupling the substrate to the heatsink, the method further comprises relieving stress between the heatsink and the substrate proximate the fasteners in three stress-relieving directions relative to a first stress-relieving component of the fasteners and a second stress-relieving component of the substrate.

In one example of the method of coupling the substrate to the heatsink, the first stress-relieving component comprises at least some fasteners each having a spring configured to expand and contract to relieve stress in the z-direction.

In one example of the method of coupling the substrate to the heatsink, the substrate includes a plurality of apertures to receive a respective fastener, and where the second stress-relieving component comprises each aperture sized to slidably interface to said respective fastener such that said fastener is moveable in at least one of the x-direction and y-direction.

In one example of the method of coupling the substrate to the heatsink, the method further comprises providing an electronic assembly having the substrate and a plurality of electronic components positioned between the heatsink and the substrate.

In one example of the method of coupling the substrate to the heatsink, the method further comprises coupling the substrate to a computing system comprising a desktop computer, a laptop, a tablet, a smartphone, a server, or a combination thereof.

In one example there is provided a computing system comprising: a motherboard; and an electronic device operably coupled to the motherboard, the electronic device including: a substrate having at least one electronic component mounted thereon; a heatsink thermally coupled to the at least one electronic component; and a plurality of fasteners coupling the substrate to the heatsink, wherein at least one of the plurality of fasteners, the substrate, and the heatsink include a stress-relieving component to minimize stress on the substrate.

In one example of the computing system, the stress-relieving component comprises one of the substrate or the heatsink having an oversized aperture that receives one of the fasteners such that said fastener is slidably interfaced to the one of the substrate or the heatsink in at least one degree of freedom during said heat transfer, and wherein the fastener is threadably secured to the other one of the substrate or the heatsink.

In one example of the computing system, the substrate includes the oversized aperture, wherein the oversized aperture has a cross sectional area larger than a cross sectional area of said fastener to facilitate said slidable interface.

In one example of the computing system, the substrate includes a plurality of stress-relieving components each comprising an oversized aperture to slidably receive a respective fastener of the plurality of fasteners.

In one example of the computing system, at least some of the plurality of fasteners each include a stress-relieving component comprising a spring configured to expand and contract to minimize fastener stress proximate the respective oversized aperture.

In one example of the computing system, the respective fasteners are freely movable in the respective oversized aperture in at least one of the x-direction and the y-direction relative to the substrate to minimize fastener stress on the substrate.

In one example of the computing system, the spring expands and contracts in the z-direction relative to the substrate to minimize fastener stress on the substrate.

In one example of the computing system, the substrate and the heatsink are coupled to each other by at least one fixed fastener defining a fixed reference point.

In one example of the computing system, the substrate includes a plurality of stress-relieving components each comprising an oversized aperture that slidably receives a respective fastener in at least one of the x-direction and the y-direction.

In one example of the computing system, a shape of each oversized aperture of each stress-relieving component directly corresponds to a distance and a direction of each respective oversized aperture from the fixed reference point.

In one example of the computing system, each fastener is threadably secured to a threaded bore in the heatsink, and wherein at least some of the fasteners are disposed through a respective oversized aperture in the substrate and slidably interfaced to the substrate in at least one of the x-direction and y-direction.

In one example of the computing system, the substrate comprises an electronic assembly having a plurality of electronic components positioned between the heatsink and the electronic assembly.

In one example of the computing system, the computing system comprises a desktop computer, a laptop, a tablet, a smartphone, a server, or a combination thereof.

In one example of the computing system, the system further comprises a processor, a memory device, a primary heatsink, a radio, a slot, a port, or a combination thereof operably coupled to the motherboard.

In one example there is provided a method of minimizing fastener stress exerted on a circuit board comprises coupling a circuit board to a heatsink with a plurality of fasteners, wherein at least one of the plurality of fasteners includes a spring to minimize fastener stress about the z-direction, and wherein one of the circuit board and the heatsink include a an oversized aperture that a respective fastener slidably interfaces to minimize fastener stress about at least one of the x-direction and the y-direction.

In one example of the method of minimizing fastener stress, the spring expands or contracts during heat transfer between the heatsink the circuit board.

In one example of the method of minimizing fastener stress, the circuit board includes a plurality of oversized apertures to slidably interface with a respective fastener such that said fastener is moveable in at least one of the x-direction and y-direction.

In one example, the method of minimizing fastener stress further comprises disposing a fixed fastener through a fixed aperture in the substrate and securing the fixed fastener to the heatsink.

In one example, the method of minimizing fastener stress disposing at least some of the fasteners through oversized apertures of the substrate, wherein the shape of each oversized aperture directly corresponds to a distance and a direction of said oversized aperture from the fixed fastener.

In one example, the method of minimizing fastener stress includes relieving stress between the heatsink and the substrate proximate the fasteners in at least one stress-relieving direction relative to respective springs.

In one example, the method of minimizing fastener stress includes relieving stress between the heatsink and the substrate proximate the fasteners in three stress-relieving directions relative to the oversized aperture.

In one example, the method of minimizing fastener stress providing an electronic assembly having the substrate and a plurality of electronic components positioned between the heatsink and the substrate.

In one example, the method of minimizing fastener stress coupling the substrate to a computing system comprising a desktop computer, a laptop, a tablet, a smartphone, a server, or a combination thereof.

In one example, there is provided a compliant fastener coupling a heatsink to a circuit board, the compliant fastener comprising: a head body partially disposable through an aperture of a circuit board or a heatsink; a threaded body securable to the other one of the circuit board and the heatsink; and a compliant device coupling the head body to the threaded body, whereby the compliant device is configured to expand or contract to minimize stress on the circuit board proximate the fastener and the aperture.

In one example of the compliant fastener, the compliant device is a spring.

In one example of the compliant fastener, the spring has an upper interface portion attached to the head body and a lower interface portion attached to the threaded body such that the head body and the threaded body are spatially separated about the spring.

In one example of the compliant fastener, the fastener expands or contracts in a z-direction about an elongated axis of the fastener when coupled to the circuit board and the heatsink during assembly, and when the circuit board is operating and transferring heat to the heatsink.

In one example there is provided an electronic device having the compliant fastener, wherein the electronic device includes the circuit board and the heatsink, wherein the circuit board includes the aperture slidably interfaced to the compliant fastener to relieve stress on the circuit board proximate the aperture.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device comprising:
    a substrate having at least one electronic component mounted thereon;
    a heatsink thermally coupled to the at least one electronic component; and
    a plurality of fasteners coupling the heatsink to the substrate, wherein the substrate and the heatsink are coupled to each other by at least one fixed fastener defining a fixed reference point, and wherein the substrate includes a plurality of stress relieving components each comprising an oversized aperture that slidably receives a respective fastener in at least one of an x-direction and a y-direction, each oversized aperture having a shape that directly corresponds to a distance and a direction of each respective oversized aperture from the fixed reference point.

2. The device of claim 1, wherein at least one of the plurality of fasteners further comprises a compliant device configured to expand and contract to minimize fastener stress.

3. The device of claim 2, wherein the compliant device is a spring, wherein said at least one of the plurality of fasteners comprises a head body and a threaded body attached together by the spring.

4. The device of claim 1, wherein the plurality of fasteners are threadably secured to the heatsink.

5. The device of claim 4, wherein the oversized apertures have a cross sectional area larger than a cross sectional area of said fastener to facilitate said slidable interface.

6. The device of claim 1, wherein the plurality of fasteners each include a stress relieving component comprising a spring configured to expand and contract to minimize fastener stress proximate the respective oversized aperture.

7. The device of claim 6, wherein the spring expands and contracts in the z-direction relative to the substrate to minimize fastener stress on the substrate.

8. The device of claim 1, wherein each fastener is threadably secured to a threaded bore in the heatsink.

9. The device of claim 1, wherein the substrate comprises an electronic assembly having a plurality of electronic components positioned between the heatsink and the substrate.

10. A method of coupling a substrate to a heatsink, the method comprising:
    disposing a fixed fastener through a fixed aperture in the substrate and securing the fixed fastener to the heatsink such that said fixed fastener and fixed aperture is devoid of a stress relieving component;
    coupling a plurality of fasteners to the substrate through apertures therein;
    threadably securing the plurality of fasteners to the heatsink;
    relieving stress on the substrate proximate the apertures with a first stress relieving component comprising at least some fasteners each having a spring configured to expand and contract to relieve stress in the z-direction; and
    relieving stress on the substrate proximate the apertures with a second stress relieving component comprising each aperture being oversized and slidably interfacing with a respective fastener such that said fastener is moveable in at least one of the x-direction and y-direction, and wherein the shape of each oversized aperture directly corresponds to a distance and a direction of said oversized aperture from the fixed fastener.

11. The method of claim 10, wherein the substrate comprises at least one electronic component thermally coupled to the heatsink, and a plurality of apertures that receive respective fasteners.

12. The method of claim 10, further comprising providing an electronic assembly having the substrate and a plurality of electronic components positioned between the heatsink and the substrate.

13. The method of claim 10, further comprising coupling the substrate to a computing system comprising a desktop computer, a laptop, a tablet, a smartphone, a server, or a combination thereof.

14. A method of coupling a substrate to a heatsink, the method comprising coupling a heatsink to a substrate with a plurality of fasteners, wherein at least one of the substrate, the heatsink, and the plurality of fasteners include a stress relieving component to minimize fastener stress on the substrate; and relieving stress between the heatsink and the substrate proximate the fasteners in three stress relieving directions relative to a first stress relieving component of the fasteners and a second stress relieving component of the substrate.

15. The method of claim 14, wherein the first stress relieving component comprises at least some fasteners each having a spring configured to expand and contract to relieve stress in the z-direction.

16. The method of claim 14, wherein the substrate includes a plurality of apertures to receive a respective fastener, and where the second stress relieving component comprises each aperture sized to slidably interface to said respective fastener such that said fastener is moveable in at least one of the x-direction and y-direction.

* * * * *